United States Patent
Masumizu et al.

(10) Patent No.: US 7,826,295 B2
(45) Date of Patent: Nov. 2, 2010

(54) SEMICONDUCTOR MEMORY DEVICE INCLUDING A REPAIR CIRCUIT WHICH INCLUDES MODE FUSES

(75) Inventors: Atsushi Masumizu, Tokyo (JP); Sadayuki Okuma, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 324 days.

(21) Appl. No.: 12/076,063

(22) Filed: Mar. 13, 2008

(65) Prior Publication Data

US 2008/0225620 A1 Sep. 18, 2008

(30) Foreign Application Priority Data

Mar. 15, 2007 (JP) .............................. 2007-066084

(51) Int. Cl.
*G11C 17/18* (2006.01)

(52) U.S. Cl. ................... 365/225.7; 365/200; 365/201; 365/189.07

(58) Field of Classification Search ............. 365/225.7, 365/200, 201, 189.07
See application file for complete search history.

(56) References Cited

U.S. PATENT DOCUMENTS

| 6,834,016 | B2 * | 12/2004 | Kato et al. ................... 365/200 |
| 6,967,888 | B2 * | 11/2005 | Hiraki et al. ................ 365/222 |
| 7,152,187 | B2 * | 12/2006 | Tran et al. ..................... 714/42 |
| 2008/0101141 | A1 * | 5/2008 | Choo et al. ................. 365/200 |
| 2008/0247243 | A1 * | 10/2008 | Kang et al. ............ 365/189.07 |
| 2009/0196113 | A1 * | 8/2009 | Jeong ......................... 365/200 |

FOREIGN PATENT DOCUMENTS

| JP | 2002-74961 | 3/2002 |
| JP | 2004-164737 | 6/2004 |

\* cited by examiner

*Primary Examiner*—Tuan T. Nguyen
(74) *Attorney, Agent, or Firm*—McGinn IP Law Group, PLLC

(57) ABSTRACT

In a semiconductor memory device, a repair circuit includes mode fuses to select one of plural repair modes corresponding to plural kinds of defects, respectively. The semiconductor memory device can repair a defective memory cell having operational margin defect without using redundancy memory cells.

19 Claims, 5 Drawing Sheets

SEMICONDUCTOR MEMORY DEVICE INCLUDING A REPAIR CIRCUIT WHICH INCLUDES MODE FUSES

This application is based upon and claims the benefit of priority from Japanese patent application No. 2007-66084, filed on Mar. 15, 2007, the disclosure of which is incorporated herein in its entirety by reference.

BACKGROUND OF THE INVENTION

This invention relates to a semiconductor memory device, in particular, to a semiconductor memory device providing a repair circuit for repairing a defective cell.

In a semiconductor device such as a DRAM or SRAM, all memory cells corresponding to addresses must operate correctly. This means that two hundred and sixty million memory cells must operate correctly in a case of a semiconductor device having a capacity of 256 M bits, for example. Practically, it is impossible to manufacture such a semiconductor memory device including a large number of memory cells so that all of the memory cells may operate correctly.

Therefore, in a related semiconductor memory device, spare selection lines and spare memory cells are previously provided to give redundancy. When there is a defective memory cell, it is replaced by a spare redundant memory cell. That is, in the related semiconductor memory device, normal memory cell and defective memory cell are distinguished by a wafer test and the defective memory cell is replaced by a redundant memory cell as shown in FIG. 1.

Here, it is known that defects of the memory cell include a case where the memory cell is physically broken and a case of so called an operational margin defect which occurs only on specific operating condition. The physical defect is caused by various factors, such as a defect of a reticle, a foreign body introduced into a wafer during impurity diffusion, lack of process margin and so on. There is no way to repair the defective memory cell caused by the physical factor except for replacing by the redundant memory cell as mentioned above.

On the other hand, regarding the operational margin defect, there is a case where it is repaired by timing adjustment of some signal. Therefore, in another related semiconductor memory device, a signal timing adjustment is applied to a memory cell judged defective at a wafer test as illustrated in FIG. 2. When the memory cell applied with the signal timing adjustment operates correctly in an additional wafer test, it is not replaced by a redundant memory cell but repaired by signal timing adjustment. When the memory cell applied with the signal timing adjustment is judged defective in the additional wafer test, it is repaired by replacing by the redundant memory cell. Such a semiconductor memory device is disclosed in Japanese Unexamined Patent Application Publication No. 2004-164737 or No. 2002-74961.

SUMMARY OF THE INVENTION

Generally, the number of defective memory cells becomes large as memory capacity (e.g. the number of memory cells) becomes large. Accordingly, the number of redundant memory cells to be necessary becomes large as the memory capacity increases. Therefore, the former related semiconductor memory device in which all defective memory cells are replaced by redundant memory cells has disadvantage that it is hard to miniaturize.

On the other hand, the latter related semiconductor memory device in which defective memory cells having operational margin defects are repaired by signal timing adjustment can be miniaturized as compared with the former related semiconductor memory device. This is because the number of redundant memory cells to be necessary is smaller. However, the latter related semiconductor memory device is structured to change timing of a specific signal. Therefore, the latter related semiconductor memory device has disadvantage that it can not deal with plural kinds of operational margin defects.

It is therefore an object of this invention to provide a semiconductor memory device which can repair defective cells having plural kinds of operational margin defects.

Other objects of this invention will become clear as the description proceeds.

According to an aspect of this invention, a semiconductor memory device includes a repair circuit which includes mode fuses to select one of repair modes corresponding to plural kinds of defects.

The semiconductor memory device can repair defective memory cells having plural kinds of operational margin defects because is has mode fuses to select one of repair modes corresponding to the plural kinds of operational margin defects.

DESCRIPTION OF THE PREFERRED EMBODIMENT

The description will be made about a semiconductor memory device according to a preferred embodiment of this invention with reference to attached drawings.

Figure 1:
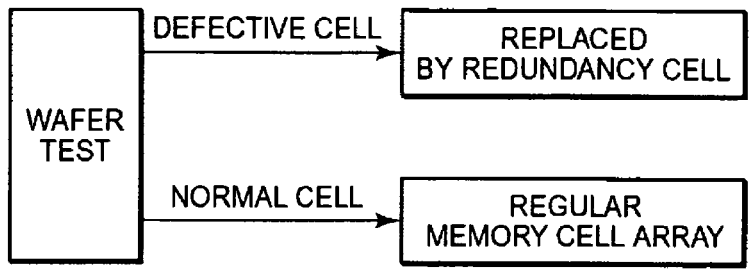
FIG. 1 is a diagram for describing physical repair of a defective memory cell in a related semiconductor memory device.
Figure 2:
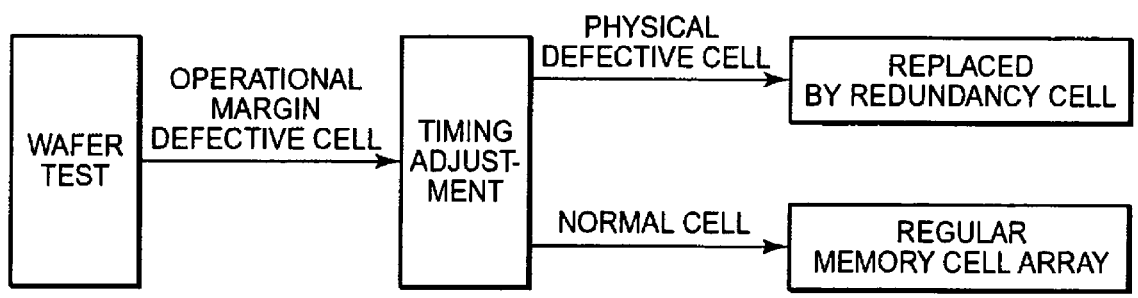
FIG. 2 is a diagram for describing repair of a defective memory cell by signal timing adjustment in another related semiconductor memory device.
Figure 3:
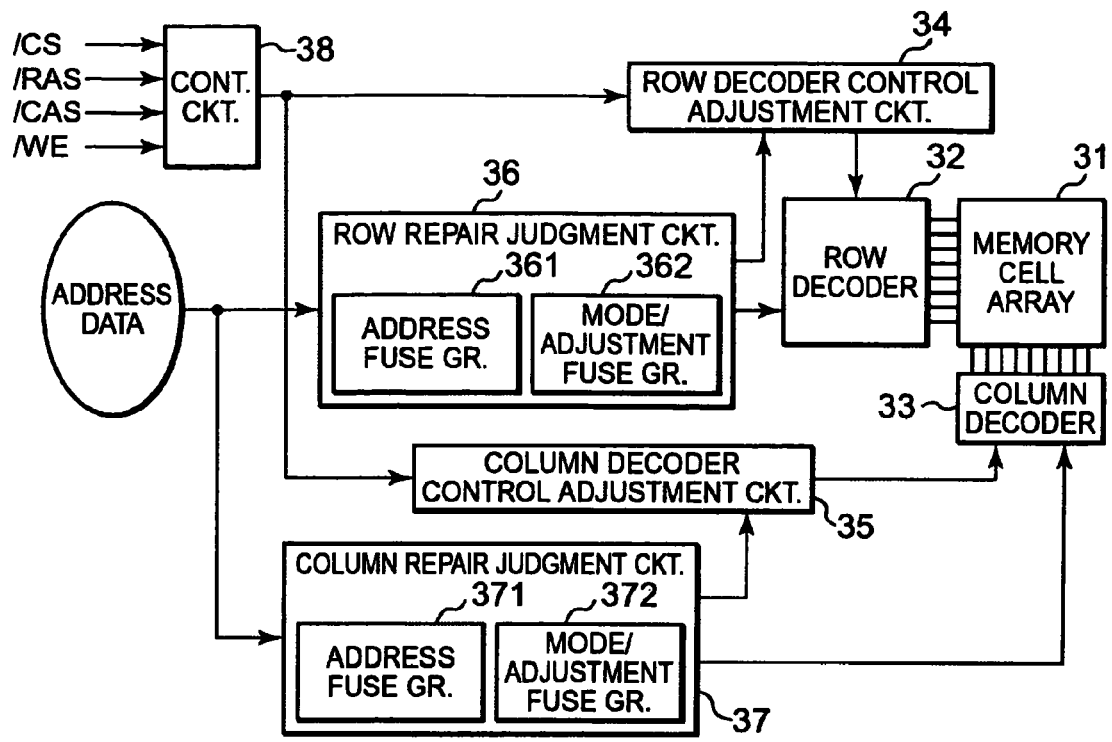
FIG. 3 is a block diagram showing a structure of a semiconductor memory device according to a preferred embodiment of this invention.

FIG. 3 is a block diagram showing a structure of a semiconductor memory device according to the preferred embodiment of this invention.

The semiconductor memory device includes a memory cell array 31, a row decoder 32, a column decoder 33, a row decoder control adjustment circuit 34, a column decoder control adjustment circuit 35, a row repair judgment circuit 36, a column repair judgment circuit 37, and a control circuit 38. In this embodiment, the row repair judgment circuit 36, a column repair judgment circuit 37 and delay adjustment circuits (see FIG. 6 or 7) provided in the row decoder control adjustment circuit 34 and the column decoder control adjustment circuit 35 serve as a repair circuit.

The row repair judgment circuit 36 and the column repair judgment circuit 37 include address fuse groups 361 and 371 and mode/adjustment fuse groups 362 and 372, respectively. Each of the fuse groups 361, 362, 371 and 372 includes a plurality of fuses which are arranged.

Each of fuses in the address fuse group 361 or 371 may be set (or cut) according to an address of a relief objective. Moreover, each of fuses in the mode/adjustment fuse group 362 or 372 may be set (or cut) according to a relief mode and/or an amount of timing adjustment.

As mentioned later, the row repair judgment circuit 36 includes an address comparison circuit including the address fuse group 361, and a mode/adjustment circuit including the mode/adjustment fuse group 362. Similarly, the column repair circuit 37 includes another address comparison circuit including the address fuse group 371, and another mode/adjustment circuit including the mode/adjustment fuse group 372. The row repair judgment circuit 36 and the column repair judgment circuit 37 output repair signals (e.g. timing repair signals and/or physical repair signals) according to setting of the mode/adjustment fuse groups 362 and 372, respectively, when input address corresponds with setting address set into the address fuse groups 361 and 371. The timing repair signal to be used for timing adjustment is supplied to the row decoder control adjustment circuit 34 or the column decoder control adjustment circuit 35. The physical repair signal to be used for replace of the redundant memory cell is supplied to the row decoder 32 or the column decoder 33 or a redundant decoder corresponding to either the row decoder 32 or the column decoder 33.

The row decoder control adjustment circuit 34 and the column decoder control adjustment circuit 35 are controlled by the control circuit 38 to produce and adjust a signal for controlling the row decoder 32 and the column decoder 33.

Figure 4:
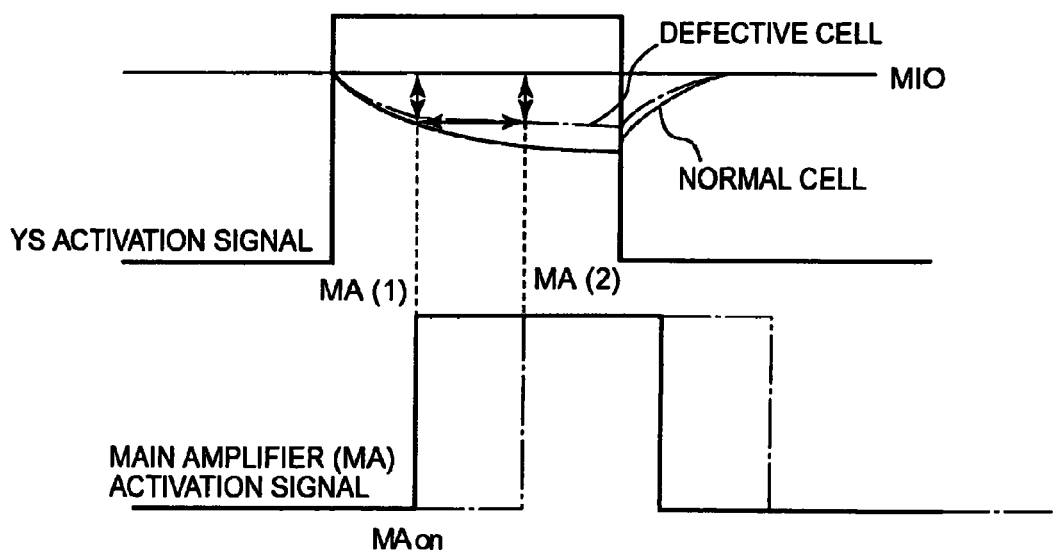
FIG. 4 is a waveform chart for describing a principle of repair of a defective memory cell by signal timing adjustment in the semiconductor memory device of FIG. 3.

Next, referring to FIG. 4, the description will made about a principle of repair of defective memory cells by signal timing adjustment. Hereinafter, the description will be directed to a case where timing of activation signal to be supplied to a main amplifier is adjusted with respect to a rising edge of an activation signal to be supplied to a column selection line (YS). Timing of other signals can be adjusted by similar manner.

As shown in FIG. 4, it is assumed that the main amplifier is activated according to timing MA(1) after a rising edge of a YS activation signal when a memory cell is normal. In this case, a potential of a main input output line (MIO) gradually decreases after the rise of the YS activation signal and turns into increase when fall of the YS activation signal. In a case of a defective memory cell, the potential of MIO also begin to decrease when the rise of the YS activation signal. However, a longer time is necessary to decrease to the predetermined value as compared with the case of the normal memory cell. In such a case, it is impossible to obtain a normal output from the memory cell even if the main amplifier is activated in the timing MA(1). By contrast, if the potential of MIO decreases to the predetermined value when the activation timing of the main amplifier is delayed to timing MA(2), it is possible to obtain the normal output from the memory cell. That is, the defective memory cell can be repaired by changing the activation timing of the main amplifier without being replaced by a redundant memory cell. In this embodiment, such timing adjustment is performed by means of fuses.

Figure 5:
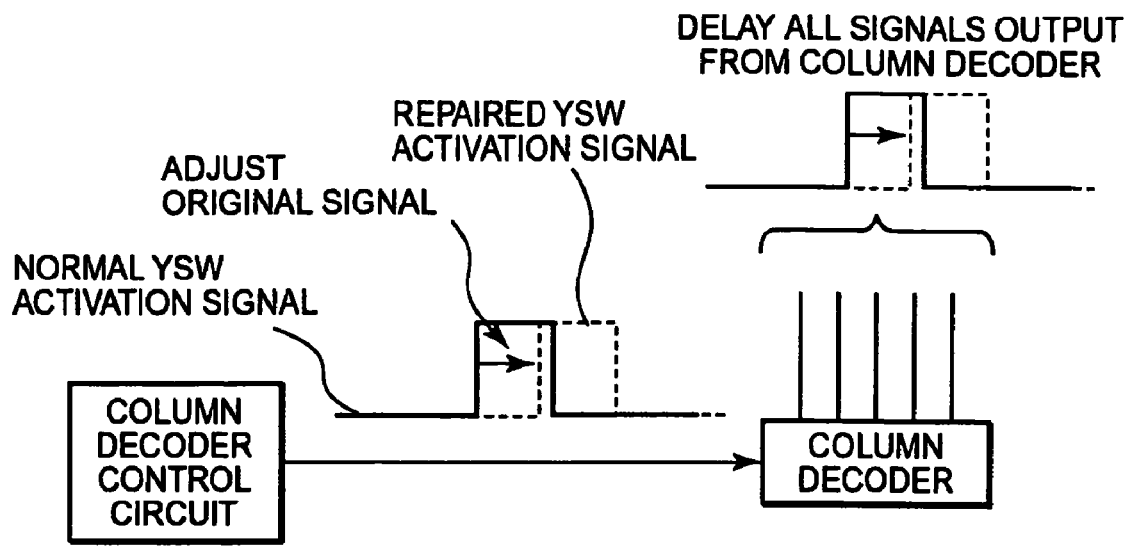
FIG. 5 is a diagram for describing a problem in signal timing adjustment using a fuse.

Here, each column selection line is commonly connected to plural memory cells, for example, sixteen memory cells in a case of a x16 product. Accordingly, signal timing of a column control system is common to all of the memory cells connected to the same column selection line. In other words, if the activation timing of the main amplifier is changed for a certain memory cell by using fuses as mentioned above, it means that the activation timing of the main amplifier is changed for all of the memory cells connected to the same column selection line as illustrated in FIG. 5.

By the way, the defect which can be repaired by the signal timing adjustment is often caused by process variation or the like. Accordingly, when a certain memory cell is judged an operational margin defective memory cell, there is a tendency that surrounding memory cells have similar characteristics. In addition, the semiconductor memory device is designed to secure a certain level of timing margin. Therefore, even if the signal timing adjustment mentioned above is made, there is a good chance that the semiconductor memory device normally operates without problems.

Figure 6:
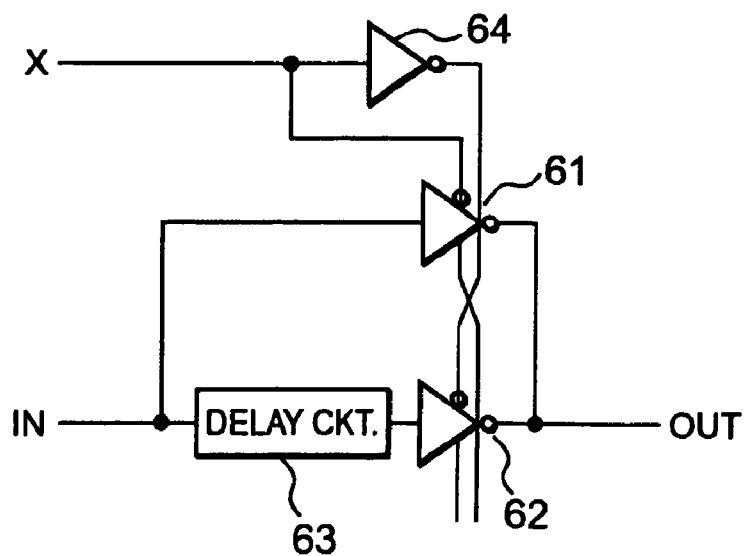
FIG. 6 is a circuit diagram showing an example of a delay adjustment circuit which is used in the semiconductor memory device of FIG. 3.

To adjust the signal timing, a delay adjustment circuit including clocked inverters and shown in FIG. 6 can be used, for example.

The delay adjustment circuit of FIG. 6 includes, between an input IN and an output OUT, a first path having a first clocked inverter 61 and a second path having a second clocked inverter 62 and a delay circuit 63. The first clocked inverter has an inverting clock terminal to which a signal X is directly input while the second clocked inverter has an inverting clock terminal to which a logical inverted signal of the signal X from a NOT circuit 64 is input.

A signal supplied to the input IN reaches the output OUT through the first or the second paths. In particular, the signal supplied to the input IN reaches the output OUT without substantial delay through the first path when the control input X is a logical low level. The signal supplied to the input IN is delayed by the delay circuit 63 and reaches the output OUT through the second path when the control input X is a logical high level. Thus, the delay adjustment circuit of FIG. 6 can selectively output a delayed signal which is delayed for a set time set in the delay circuit 63 or a non-delayed signal. Incidentally, the first and the second clocked inverter 61 and 62 serve as a gate circuit to select either the first or the second path.

Figure 7:
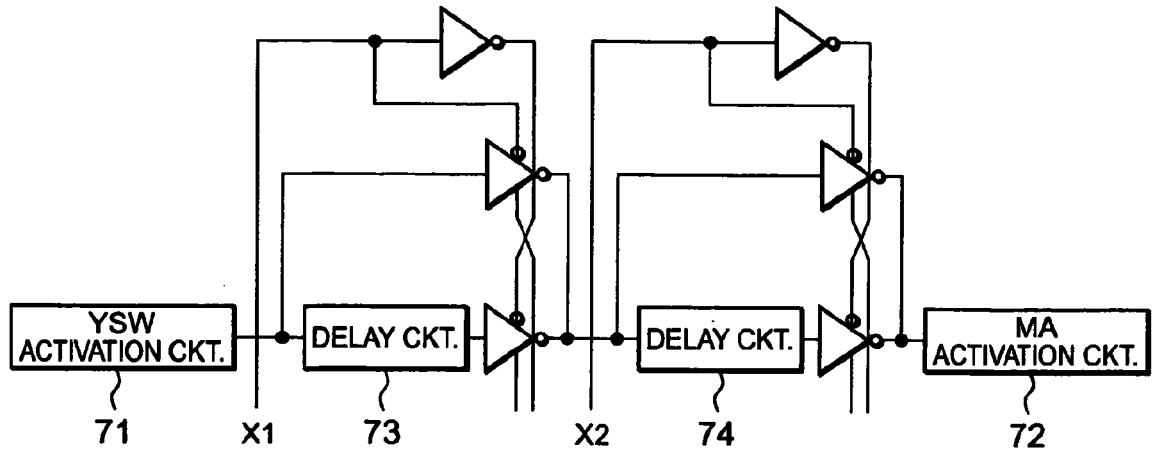
FIG. 7 is a circuit diagram showing an example of a multistage delay adjustment circuit including a plurality of delay adjustment circuits of FIG. 6.

To vary the amount of the delay to plural levels, plural delay adjustment circuits may be connected in multiple-stage as illustrated in FIG. 7. In such a case, when both control inputs X1 and X2 are the logical low level, an output of YSW (column switch) activation circuit 71 is supplied to a MA activation circuit 72 without substantial delay. When either the control input X1 or X2 is the logical high level, the output of the YSW activation circuit 71 is delayed by a delay circuit 73 or 74 and supplied to the MA activation circuit 72. When both the control input X1 and X2 are the logical high level, the output of the YSW activation circuit 71 is delayed by both the delay circuits 73 and 74 and supplied to the MA activation circuit 72.

Additionally, with the structure of FIG. 7, the signal timing can be not only delayed but advanced when a delayed signal delayed by one of the delay circuits 73 and 74 is employed as a standard.

Next, the description will be made about the column repair judgment circuit 37 with reference to FIG. 8. Because the row repair judgment circuit 36 is similar to the column repair judgment circuit 37, its explanation is omitted here.

Figure 8:
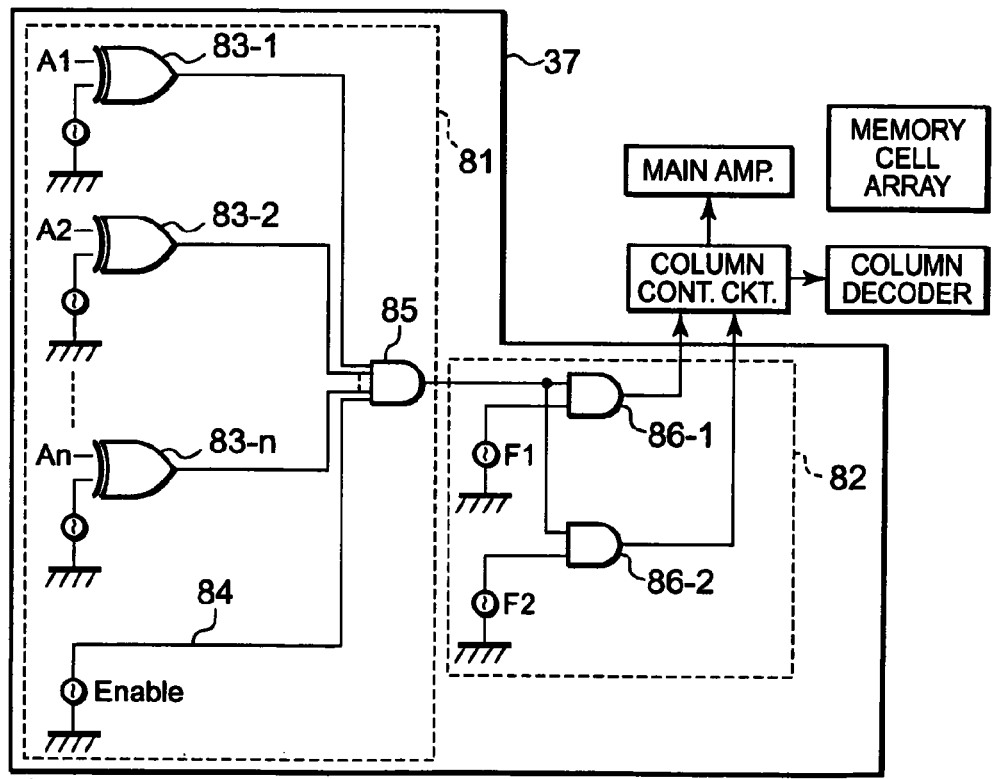
FIG. 8 is a circuit diagram for describing a row repair judgment circuit which is used in the semiconductor memory device of FIG. 3.

As illustrated in FIG. 8, the column repair judgment circuit 37 includes an address comparison circuit 81 and a mode-selection/adjustment circuit 82. The address comparison circuit 81 includes plural exclusive logical OR gates 83-1, 83-2, . . . , and 83-n, an enable line 84 and an AND gate 85 connected to the exclusive logical OR gates 83 and the enable line 84. The mode-selection/adjustment circuit 82 includes plural (here two) AND gates 86-1 and 86-2.

Each fuse connected to one input of each of the exclusive logical OR gates 83-1, 83-2, . . . , and 83-n belongs to the address fuse group 371 and is for designating an address. Each fuse connected to one input of each of the AND gates 86-1 and 86-2 belongs to the mode/adjustment fuse group 372 and designating a repair mode and/or amount of adjustment.

Figure 9:
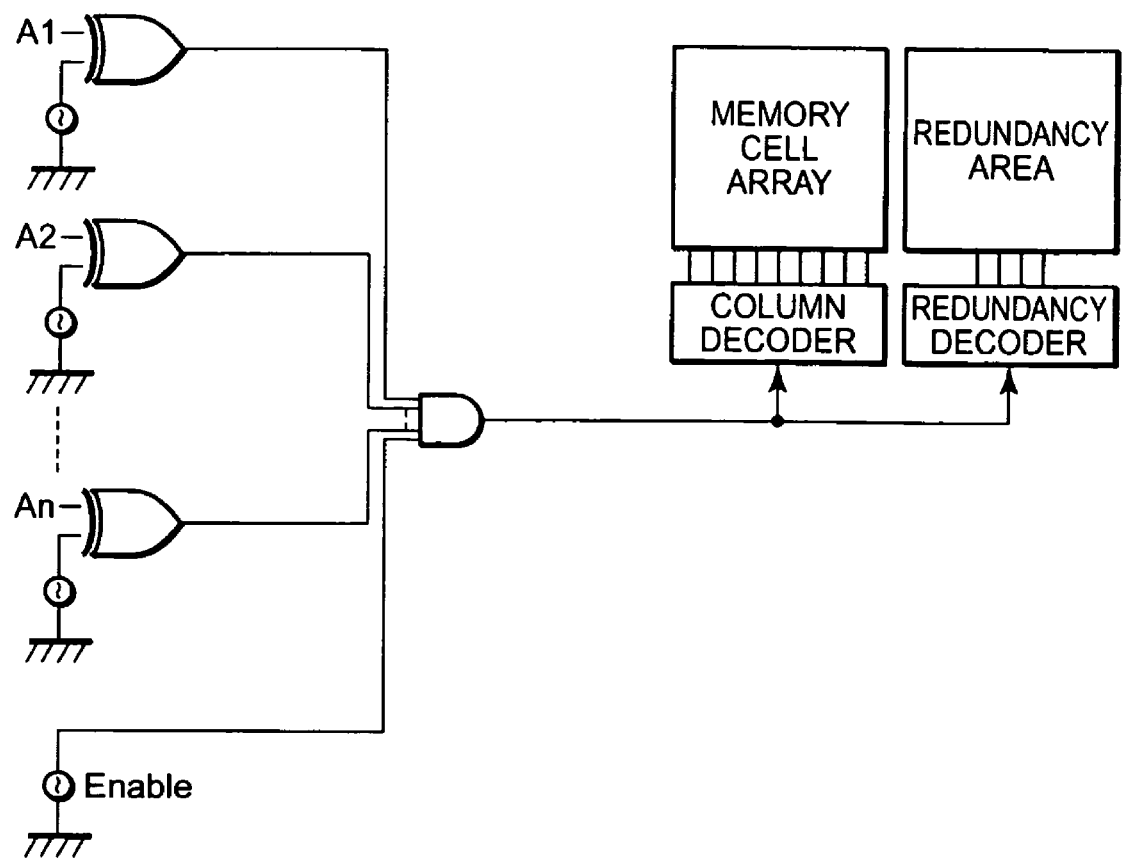
FIG. 9 is a block diagram showing a structure for physical repair.

Though FIG. 8 shows an example that two mode/adjustment signals (repairing signals) can be produced for one address, the column repair judgment circuit 17 generally includes plural address comparison circuits 81 and corresponding mode-selection/adjustment circuits 82 for plural addresses. Furthermore, the mode-selection/adjustment circuit 82 may be provided with three or more combinations of AND gates and fuses to handle more repair modes and levels of adjustment amount. One of the combinations of AND gates and fuses may be used for achieving physical repair as shown in FIG. 9.

The address comparison circuit 81 deals with n bits address data A1-An. By cutting the fuse, the corresponding input of the exclusive logical OR gate 83 (83-1, 83-2, . . . , or 83-n) is changed from the logical low level to the logical high level (or a floating level). As for the enable line 62, it is similar.

Repair is executed as follows.

The fuses connected to the exclusive logical OR gates 83-1, 83-2, . . . , and 83-n are individually cut or remained to supply inverted data of address data to be repaired to the exclusive logical OR gates 83-1, 83-2, . . . , and 83-n. In such a state, when the address data A1-An to be repaired are supplied to the other inputs of the exclusive logical OR gates 83-1, 83-2, . . . , and 83-n, all of the exclusive logical OR gates 83-1, 83-2, . . . , and 83-n output the logical high level. Thus, when the address data A1-An supplied to the exclusive logical OR gates 83-1, 83-2, . . . , and 83-n coincide with set address set by the fuses, the output of the AND gate changes from the logical low level to the logical high level. When the address data A1-An differ from the set address, the output of the AND gate remains the logical low level.

In the mode-selection/adjustment circuit 82, when the fuses F1 and F2 are not cut, outputs of the AND gates 86-1 and 86-2 are the logical low level regardless of the output of the AND gate 85. When the fuses F1 and F2 are cut, the outputs of the AND gates 86-1 and 86-2 depend on the output of the AND gate 85. If the AND gates 86-1 and 86-2 are used for repairing different kind defects, the fuses F1 and F2 serve as mode fuses for selecting repairing modes. Moreover, if the AND gates 86-1 and 86-2 are used for adjusting delay amount of the signal timing adjustment in a certain repairing mode, the fuses F1 and F2 serve as timing adjustment fuses. In a case where the mode-selection/adjustment circuit 82 includes three or more combinations of AND gates and fuses, each of the fuses may serve as the mode fuse, the timing adjustment fuse or both of them.

The mode-selection/adjustment 82 circuit is not limited to the configurations mentioned above and can only have to change its output according to both change of the output of the AND gate 85 and setting of fuses. To configure the mode-selection/adjustment circuit 82, NAND gates, exclusive logical OR gates, inverted exclusive logical OR (NEOR) circuits, OR circuits and/or NOT circuits may be used or combined according to intended purpose thereof.

Furthermore, the mode-selection/adjustment 82 circuit may have different configurations corresponding to repair modes. For example, the mode-selection/adjustment 82 may be configured so that one repair signal is produced in a certain repair mode and two repair signals are produced in another repair mode. The repair modes may include a mode for repairing defect caused by lack of write margin, a mode for repairing defect caused by lack of read margin or the like besides a mode for adjusting activation timing of the main amplifier.

When a memory cell is judged defective by a wafer test, signal timing adjustment and an additional wafer test are performed for the memory cell. If the additional wafer test judges that the memory cell can be repaired, the address fuses included in the address comparison circuit 81 are set (or selectively cut) according to the objective address. Furthermore, the fuses included in the mode-selection/adjustment circuit 82 are set (or selectively cut) according to the repair mode and the amount of the timing adjustment. After that, the memory cell is tested regarding the objective address to confirm normal operation.

As mentioned above, because the semiconductor memory device according to the present embodiment is provided with the fuses for selecting the repair modes, memory cells having plural kinds of operational margin defects can be repaired without being replaced by redundancy memory cells. Therefore, the number of the redundancy memory cells to be provided for repairing defective memory cells can be reduced and thereby a memory chip area can be reduced. In other words, the semiconductor memory device of the present embodiment can repair more defective memory cells even though it has the same memory chip area as the related device.

While this invention has thus far been described in conjunction with the preferred embodiments thereof, it will readily be possible for those skilled in the art to put this invention into practice in various other manners.

What is claimed is:

1. A semiconductor memory device comprising:
   a repair circuit which includes mode fuses to select one of repair modes corresponding to plural kinds of defects, wherein said repair circuit comprises:
   an address comparison circuit which includes address fuses for designating a repair objective address and a comparison unit for comparing the repair objective address and an input address to produce a comparison result; and
   an adjustment circuit which includes said mode fuses and produces a repair signal according to the comparison result and a selected repair mode selected by said mode fuses.

2. A semiconductor memory device as claimed in claim 1, wherein said mode fuses also serve as timing adjustment fuses to adjust signal timing for repairing operational margin defects.

3. A semiconductor memory device as claimed in claim 1, further comprising:
   two transmission paths having different delay times; and
   a gate circuit which select either of said transmission paths according to the repair signal.

4. A semiconductor memory device as claimed in claim 1, wherein the repair modes include a mode for repairing a physical defect.

5. A semiconductor memory device as claimed in claim 2, further comprising:
   two transmission paths having different delay times; and
   a gate circuit which selects either of said transmission paths according to the repair signal.

6. A semiconductor memory device as claimed in claim 1, wherein the repair modes include a mode for repairing at least one of a main amplifier activation timing defect, a defect caused by lack of write margin and a defect caused by lack of read margin.

7. A semiconductor memory device as claimed in claim 2, wherein the repair modes include a mode for repairing at least one of a main amplifier activation timing defect, a defect caused by lack of write margin and a defect caused by lack of read margin.

8. A semiconductor memory device as claimed in claim 5, wherein the repair modes include a mode for repairing at least one of a main amplifier activation timing defect, a defect caused by lack of write margin and a defect caused by lack of read margin.

9. A semiconductor memory device, comprising;
a repair circuit which includes mode fuses to select one of repair modes corresponding to plural kinds of defect.
wherein the repair modes include a mode for repairing at least one of a main amplifier activation timing defect, a defect caused by lack of write margin and a defect caused by lack of read margin.

10. A semiconductor memory device comprising:
a repair circuit which comprises:
 a fuse set including a plurality of fuses;
 mode fuses set to select one of repair modes corresponding to plural kinds of defects;
 first and second output nodes; and
 a select circuit which supplies an output from the fuse set to at least one of the first and second output nodes according to setting of the mode fuses.

11. A semiconductor memory device as claimed in claim 10, wherein the fuse set comprises:
address fuses set to designate a repair objective address; and
an address comparison circuit including a comparison unit which compares the repair objective address with an input address to produce a comparison result, and
wherein the select circuit supplies the comparison result being the output from the fuse set as a repair signal, to the at least one of the first and second output nodes.

12. A semiconductor memory device as claimed in claim 11, wherein the mode fuses also serve as timing adjustment fuses to adjust signal timing for repairing operational margin defects.

13. A semiconductor memory device as claimed in claim 11, further comprising:
two transmission paths having different delay times; and
a gate circuit which selects either of said transmission paths according to the repair signal.

14. A semiconductor memory device as claimed in claim 12, further comprising:
two transmission paths having different delay times; and
a gate circuit which selects either of said transmission paths according to the repair signal.

15. A semiconductor memory device as claimed in claim 10, wherein the repair modes include a mode for repairing at least one of a main amplifier activation timing defect, a defect caused by lack of write margin and a defect caused by lack of read margin.

16. A semiconductor memory device as claimed in, claim 11, wherein the repair modes include a mode for repairing at least one of a main amplifier activation timing defect, a defect caused by lack of write margin and a defect caused by lack of read margin.

17. A semiconductor memory device as claimed in claim 12, wherein the repair modes include a mode for repairing at least one of a main amplifier activation timing defect, a defect caused by lack of write margin and a defect caused by lack of read margin.

18. A semiconductor memory device as claimed in claim 13, wherein the repair modes include a mode for repairing at least one of a main amplifier activation timing defect, a defect caused by lack of write margin and a defect caused by lack of read margin.

19. A semiconductor memory device as claimed in claim 10, wherein the mode fuses comprise first and second fuses corresponding to the first and second output nodes, respectively, and
wherein the select circuit controls whether or not to supply the output from the fuse set to the first and second output nodes according to setting of the first and second fuses, respectively.

* * * * *